(12) United States Patent
Akram

(10) Patent No.: US 6,576,993 B2
(45) Date of Patent: Jun. 10, 2003

(54) PACKAGES FORMED BY ATTACHING A SEMICONDUCTOR CHIP TO A LEADFRAME WITH A FOOTPRINT OF ABOUT THE SAME SIZE AS THE CHIP

(75) Inventor: Salman Akram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/045,825

(22) Filed: Oct. 19, 2001

(65) Prior Publication Data

US 2002/0061607 A1 May 23, 2002

Related U.S. Application Data

(62) Division of application No. 09/336,127, filed on Jun. 18, 1999, now Pat. No. 6,387,732.

(51) Int. Cl.[7] ............................................. H01L 23/498
(52) U.S. Cl. ...................... 257/696; 257/704; 257/707; 257/784; 257/787
(58) Field of Search ................................. 257/696, 704, 257/707, 778, 782, 784, 787

(56) References Cited

U.S. PATENT DOCUMENTS

| 5,086,018 A | * | 2/1992 | Conru et al. ............... 437/207 |
| 5,286,679 A | | 2/1994 | Farnworth et al. |
| 5,418,189 A | | 5/1995 | Heinen |
| 5,434,105 A | | 7/1995 | Liou |
| 5,434,357 A | * | 7/1995 | Belcher et al. ............ 174/52.2 |
| 5,483,024 A | | 1/1996 | Russell et al. |
| 5,519,251 A | * | 5/1996 | Sato et al. ................... 257/666 |
| 5,554,886 A | | 9/1996 | Song |
| 5,674,785 A | | 10/1997 | Akram et al. |
| 5,677,566 A | | 10/1997 | King et al. |
| 5,729,049 A | | 3/1998 | Corisis et al. |
| 5,773,313 A | | 6/1998 | Sato et al. |
| 5,834,830 A | * | 11/1998 | Cho ............................ 257/667 |
| 5,840,599 A | | 11/1998 | Lamson et al. |
| 5,847,929 A | | 12/1998 | Bernier et al. |
| 5,849,607 A | | 12/1998 | Seo et al. |
| 5,920,118 A | * | 7/1999 | Kong .......................... 257/684 |
| 5,923,957 A | | 7/1999 | Song et al. |
| 5,951,804 A | * | 9/1999 | Kweon et al. ......... 156/244.12 |
| 5,999,413 A | * | 12/1999 | Ohuchi et al. .............. 361/772 |
| 6,175,159 B1 | * | 1/2001 | Sasaki ......................... 257/778 |
| 6,225,558 B1 | | 5/2001 | Hur |
| 6,492,204 B1 | | 12/2002 | Haba |

* cited by examiner

Primary Examiner—Carl Whitehead, Jr.
Assistant Examiner—Stephen W. Smoot
(74) Attorney, Agent, or Firm—TraskBritt

(57) ABSTRACT

Methods for forming substantially chip scale packages and the resulting structures. The methods comprise applying an adhesive on an active surface of a semiconductor chip to form a patterned adhesive layer on a portion of the active surface. A leadframe having leads with inner lead ends and outer lead ends is provided. The inner lead ends of the leads are aligned proximate to the adhesive-free area and the leads are attached to the adhesive layer on the active surface of the semiconductor chip. The outer lead ends are oriented to form a footprint which is not substantially larger than the dimensions of the semiconductor chip.

13 Claims, 9 Drawing Sheets

PACKAGES FORMED BY ATTACHING A SEMICONDUCTOR CHIP TO A LEADFRAME WITH A FOOTPRINT OF ABOUT THE SAME SIZE AS THE CHIP

CROSS-REFERENCE TO RELATED APPLICATION

This application is a divisional of application Ser. No. 09/336,127, filed Jun. 18, 1999, now U.S. Pat. No. 6,387,732, issued May 14, 2002.

BACKGROUND OF THE INVENTION

1. Field of the Invention

The present invention relates generally to a method of forming a semiconductor package and the structures formed thereby. More particularly, the invention relates to small package outlines and chip scale packages and methods of forming substantially chip scale packages of reduced size and number of parts.

2. State of the Art

In semiconductor manufacture, a single semiconductor die or chip bearing one or more integrated circuits is typically mounted within a sealed package. The package generally protects the die from physical damage and from contaminants, such as moisture or chemicals, found in the surrounding environment. The package also provides a lead system for connecting electrical devices (e.g., the integrated circuits) formed on the active surface of the die to a printed circuit board or other external circuitry. Semiconductor packages containing integrated circuit dice for a broad range of purposes are currently mass produced. Small, but measurable, savings in the packaging of one such semiconductor die or integrated circuit can generate large overall cost savings, due to large production volumes, if the reduced-cost packaging affords required package integrity and thus a high-percentage yield. Further, reduction in package size can eliminate size-based restrictions for use of a die on ever more crowded carrier substrates, such as printed circuit boards (PCBs), where available "real estate" is at a premium. Therefore, continual cost and quality improvements in the manufacture of these semiconductor packages, as well as a decrease in the overall dimensions of such packages, are of great value in the semiconductor manufacturing field.

Referring to FIG. 1, an exemplary prior art leadframe 18 used in assembling a conventional semiconductor package is shown. In the center of leadframe 18 is a die paddle 19, located between side rails 20 and 20' and held by a pair of tie bars 21 and 21'. The die paddle 19 will support a semiconductor chip 30 thereon once the semiconductor package is assembled, as shown in FIG. 2. Leadframe 18 also includes a plurality of leads 23 having inner lead ends 22 extending peripherally about die paddle 19. Extending outward from the inner lead ends 22 of leads 23 is a plurality of outer lead ends 24 that are connected to each other by means of dam bars 26.

FIG. 2 illustrates a sectional view of a semiconductor package 28 produced using the leadframe 18. Prior to the formation of the package 28, the inner lead ends 22 are electrically connected to a plurality of bond pads 32 of the semiconductor die or chip 30 by means of a plurality of metal bond wires 36, typically of gold, aluminum, or alloys thereof. Opposing ends of the metal bond wires 36 are bonded to the bond pads 32 of the semiconductor chip 30 and to the inner lead ends 22, as known in the art. In forming the package 28, the semiconductor chip 30 is fixedly attached, typically with a conductive die-attach epoxy 40, to the top surface of the die paddle 19 of the leadframe 18. The semiconductor chip 30, the inner lead ends 22, and the metal bond wires 36 are then hermetically packaged using a filled-polymer molding compound to form a package body 42. The outer lead ends 24 of the leadframe 18 extend to the outside of the package body 42, usually at opposite sides of the package body 42. Once formation of the semiconductor package 28 is complete, including a trim and form operation to separate the package from the leadframe strip, removal of dam bars 26 and deformation of outer lead ends 24 to desired orientations and shapes, the semiconductor package 28 is mounted and electrically connected to the surface of a PCB (not shown) by securing the outer lead ends 24 to conductive traces on the surface of the PCB.

During the formation of package body 42, a molten particulate-filled polymer is transferred under pressure from a reservoir into a mold (not shown) which surrounds the metal bond wires 36, the semiconductor chip 30, and portions of leadframe 18 (e.g., the inner lead ends 22). The polymer compound used during the transfer mold process is relatively viscous, and the flow front of the material has been known to displace or damage metal bond wires 36 during the mold-fill process. This is commonly referred to as "bond wire sweep" or as the "wire wash" problem. More specifically, when encapsulating a bare die assembly, the die assembly is generally placed in a mold wherein a molten filled-polymer encapsulating material is injected into the mold to surround the die assembly as it conforms to the interior cavity of the mold. However, the encapsulant flow front attendant to this process causes stresses on the bond wires. Since the molten encapsulating material is viscous and due to the orientation of the bond wires, it tends to place forces transverse to at least some of the bond wires as the encasing material is injected into the mold. These directional forces cause the bond wires to flex, which can, in turn, cause the bond wires to break, disconnect from their bond sites, or short with adjacent bond wires or bond pads.

To prevent wire wash damage, some manufacturing processes apply a protective low-viscosity glue or other topping material 46 (thickness exaggerated in FIG. 2) over the metal bond wires 36 before injecting the plastic. This glue and the process of applying it are both called glob-topping. Such preliminary topping before transfer molding freezes the wires in position and effectively protects the metal bond wires 36 during the transfer molding step.

Although the aforementioned semiconductor packages are widely used, they possess a number of shortcomings. For example, as previously described, the typical leadframe 18 used in package 28 has a die paddle 19 for holding the semiconductor chip 30 thereon. Due to differences in the coefficient of thermal expansion between components in the semiconductor package (i.e., the die paddle 19, the semiconductor chip 30, and the die-attach epoxy 40), semiconductor chip 30 may crack and interfacial separation between these components may occur. Also, use of a transfer-molded encapsulant for the package inevitably increases the overall size of the package, which results in waste of space when the package is mounted on the surface of the PCB. The relatively large number of packaging steps and components associated with transfer molding increases both cost and the likelihood of package failure. Further, as chips become more complex, such as higher memory capacity DRAMs, the increased size of a chip may preclude effective transfer-molded packaging within the parameters of a preset exterior package size implemented for earlier generations of lowercapacity memory chips. Another disadvantage seen in fabrication of semiconductor packages according to these traditional principles is the requirement of not only numerous, but specialized, fabrication steps which increase the cost and time of production. Additionally, once a transfer-molded package is formed, the package cannot be disassembled without damaging the enclosed components, making repairs or modifications to components within the finished package impossible.

In view of the foregoing limitations, there is a need in the semiconductor art for an improved method for forming semiconductor packages of compact size ("chip scale packages") and including a minimal number of component parts. Such needed compact packages may include, by way of example, fine ball grid array packages, or "FBGAs." Specifically, there is a need for an improved method for forming chip scale packages which are adaptable to carrier substrate surfaces having connection points of varying alignment and spacing configurations. There is a further need for an improved method for forming a chip scale package that does not require formation of a protective package body through transfer molding.

SUMMARY OF THE INVENTION

The present invention is directed to an improved method for forming a semiconductor chip package having a dimension which lies within a periphery substantially defined by the outside boundaries of the semiconductor chip contained therein. The improved method begins with the application of an adhesive on the active surface of a semiconductor chip to form a patterned adhesive layer on a portion of the active surface and an adhesive-free area wherein the bond pads of the semiconductor chip are located. A leadframe having leads with inner lead ends and outer lead ends is provided. The inner lead ends of the leads are aligned proximate to the adhesive-free area and the leads are attached to the adhesive layer on the active surface of the semiconductor chip. The outer lead ends are formed to have a width which is equal to, and does not extend substantially beyond, the width of the semiconductor chip, thus forming a footprint for the package which is no larger than the dimensions of the semiconductor chip. The bond pads of the semiconductor chip are then interconnected to the inner lead ends of the leads by wire bonding and the bond wires are then encapsulated, as by a silicon mass commonly referred to as a "glob-top." In some embodiments, the packaged semiconductor chip is configured as a ball grid array (BGA) package, including an FBGA.

In another embodiment, the glob-topping step is deleted. Instead, the outer lead ends of the leads are formed to receive and hold a cap. The cap is provided to protect the active surface of the semiconductor chip, thus obviating the need for glob-topping.

In yet another embodiment, after application of the adhesive layer to the active area of the semiconductor chip, tape automated bonding (TAB) tape leads in the form of metal traces carried by a flexible polymer film are then bonded to metal bumps formed on bond pads or, alternately, are bonded to the bond pads through bumps formed on TAB tape leads. TAB tape leads are then attached to the adhesive layer on the semiconductor chip. In yet another embodiment, a cap can be attached to the TAB tape leads by wrapping and adhering an outer portion of the TAB tape around the cap.

In alternate embodiments of the invention, the adhesive is applied on the leads or TAB tape leads, rather than the active surface of the semiconductor chip.

The resulting packaged chip structures created by the aforementioned methods are also contemplated as included within the present invention.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
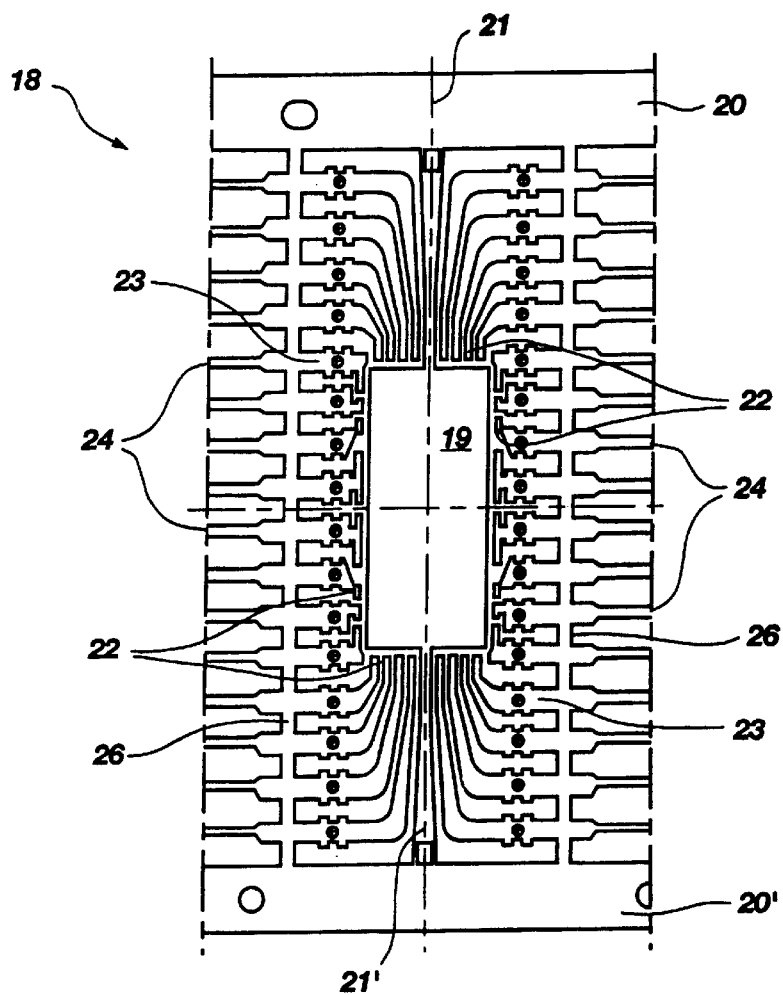
FIG. 1 is a top view of a leadframe used in assembling a prior art semiconductor package.
Figure 2:
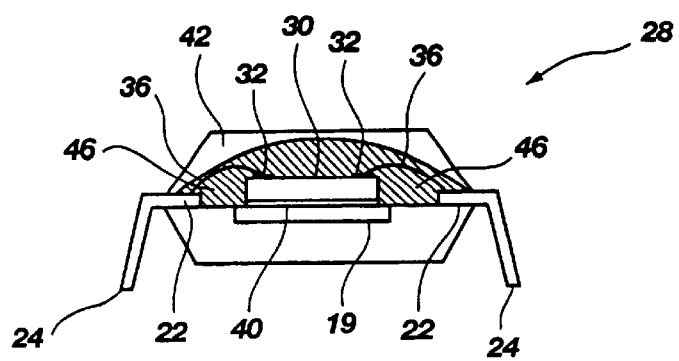
FIG. 2 is a cross-sectional view of a prior art semiconductor package structure.
Figure 3:
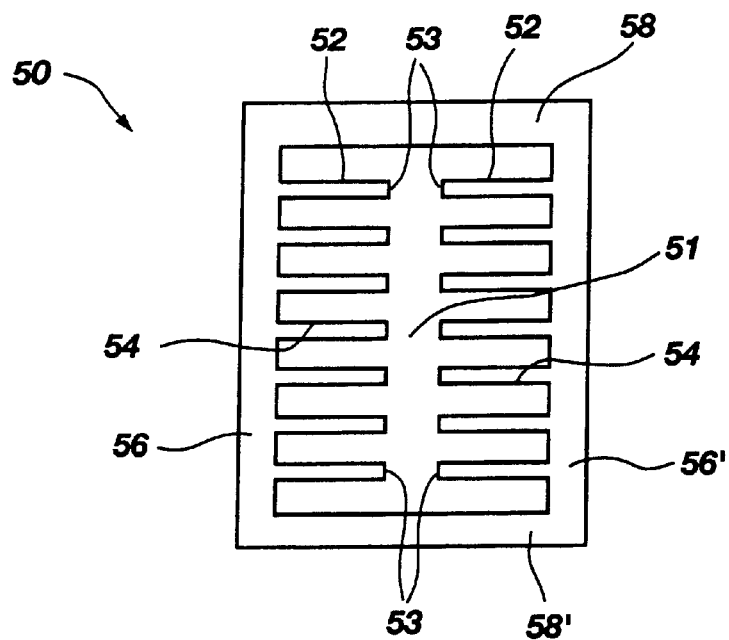
FIG. 3 is a schematic top view of a leadframe used in assembling the chip scale package of the present invention.

Referring to FIG. 3, a top view of a leadframe 50 used in assembling the chip scale package of the present invention is shown. The leadframe 50 is generally shaped to permit alignment of the leadframe over a surface of a semiconductor chip, such as seen in a lead-over-chip (LOC) package configuration. The leadframe 50 is typically produced from metal sheet stock (e.g., a copper-based alloy) and is adapted to support a semiconductor chip. Preferably, the leadframe 50 includes end rails 58 and 58', side rails 56 and 56', and a plurality of leads 52. The plurality of leads 52 extends from side rails 56 and 56' and has inner lead ends 53 radially extending to an aperture (for subsequent alignment with the bond pads 62 of the semiconductor chip 60 of FIG. 4), denoted by reference numeral 51, which is located along a central axis of the leadframe 50. Extending outwardly from the inner lead ends 53 are outer lead ends 54. As further detailed below, the inner lead ends 53 ultimately serve as electrical connection points between the leadframe 50 and the bond pads 62 on the semiconductor chip 60 (FIG. 4), and the outer lead ends 54 will eventually be attached to a carrier substrate bearing conductive traces, such as a printed circuit board (PCB) of FR-4, a ceramic material, a semiconductor material, or any other carrier structure or higher-level packaging known in the art.

In practice, leadframe 50 will generally form part of a leadframe strip comprised of a series of longitudinally juxtaposed leadframes, each of which will receive an individual chip, all as known in the art. However, only a single leadframe 50 has been depicted for clarity in describing the invention.

Figure 4:
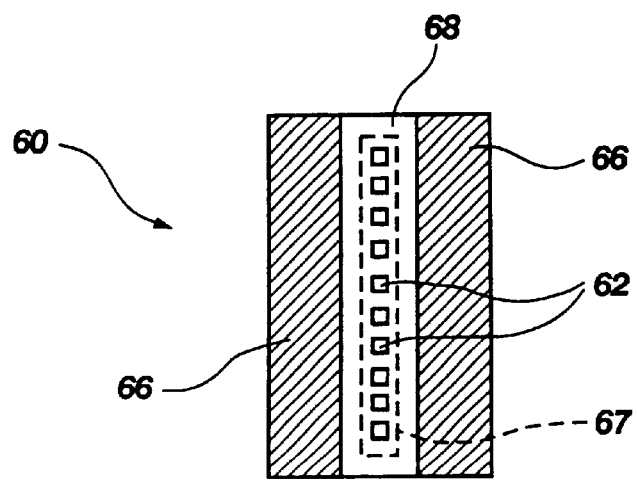
FIG. 4 is a top (active surface) view of a semiconductor chip coated with an adhesive layer in accordance with the method of the present invention.

FIG. 4 is a top, or active surface, view of an exemplary semiconductor chip 60 used in making the chip scale package of the instant invention. It is noted that the semiconductor chip 60 may be comprised of any one of various known types of semiconductor devices, including memories (such as DRAMs, SRAMs, flash memories, EPROMs, EEPROMs, etc.), microprocessors, application specific integrated circuits (ASICs), digital signal processors (DSPs) and the like. As shown in this figure, the bond pads 62 are oriented in a single, linear row along an axis located through the center of the semiconductor chip 60. However, it is understood that the present invention can be accomplished using a semiconductor chip 60 having bond pads 62 that are configured in a variety of patterns and having any number of bond pads 62, such as the bond pads 62 in FIG. 5, which are shown in a parallel, double-center row formation to more clearly illustrate the steps of the invention.

Figure 5:
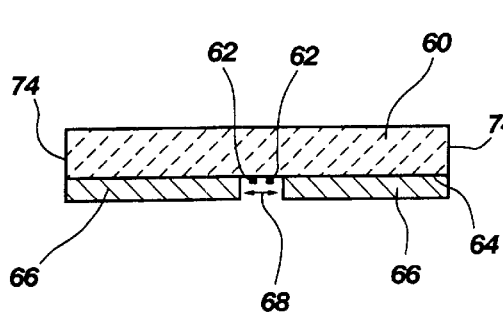
FIGS. 5–8 illustrate cross-sectional schematic views of a chip scale package in the process of fabrication in accordance with the present invention during various stages of assembly, FIG. 8 illustrating an embodiment of the finished structure.

In accordance with a preferred method of the invention, an active surface 64 (FIG. 5) of the semiconductor chip 60 (upon which the bond pads 62 are located) is coated or provided with an adhesive layer 66 (such as the thermoplastic, thermosetting, or tape adhesives described below), as shown in FIG. 4. The adhesive layer 66 is preferably formulated to function as an insulating or dielectric and passivating layer for the semiconductor chip 60, as well as to afford physical protection for the active surface 64. During the deposition process, the adhesive layer 66 is applied in a pattern such that the bond pads 62 are free of the adhesive (FIG. 4) and so as to contain the adhesive layer 66 below and within outer lateral boundaries 74 of the semiconductor chip 60 (FIG. 5). This may be accomplished by patterning an adhesive-free area 68 around the bond pads 62. An adhesive-free area 68 having a variety of widths and patterns can be created. For example, a fine pattern of the adhesive layer 66 can be employed for forming the adhesive-free areas 68 which tightly enclose the bond pads 62 (shown in broken lines 67), as opposed to creating wide, adhesive-free areas 68. Likewise, the adhesive-free areas 68 can be patterned in any shape or pattern (such as horizontally, vertically, diagonally, circular, etc.) in order to accommodate bond pads 62 having numerous shapes and forming a variety of patterns on the semiconductor chip 60.

As previously stated, adhesive layer 66 can be formed from either thermosetting or thermoplastic adhesives. When using a thermoplastic adhesive, the leadframe 50 and/or the semiconductor chip 60 should be heated, but a heat cure is not required to permanently bond the two structures. Thermoplastic adhesives can be formulated of a solid thermoplastic material which quickly melts upon heating and thereafter sets to a firm bond upon cooling. Suitable thermoplastic adhesive materials include polyimides. In contrast, when a thermosetting adhesive is used, a separate heat cure is required to set the adhesive. Suitable thermosetting adhesives include phenolic resins.

Alternatively, the adhesive can constitute an adhesive tape (e.g., dual-sided adhesive polyimide tape). Suitable adhesive materials for use on tapes include epoxies, acrylics, or silicones. The adhesive tape 66 is preferably preformed (e.g., tape punched) to include adhesive-free areas 68 that conform with the shapes and configurations of the bond pads 62 on the semiconductor chip 60.

The adhesive layer 66 can be deposited through a variety of known techniques, such as a photopatterning process. With photopatterning, an adhesive is formulated of a photosensitive material (e.g., a polyimide siloxane) and applied on the active surface 64 of the semiconductor chip 60. The photosensitive material is then exposed through a suitable mask and chemically etched (e.g., with $O_2$-based plasma or wet chemical etches, or developers) in the desired pattern. Other suitable deposition techniques include hot and cold screen printing processes and a resist etch back process. The adhesive layer 66 may be applied to the semiconductor chip 60 as part of a wafer prior to singulation of individual semiconductor chips 60 from the wafer.

Figure 6:
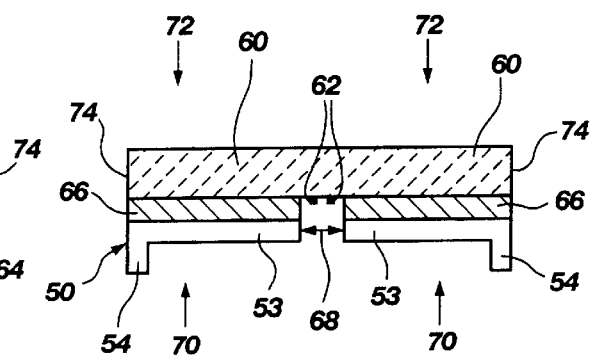

As depicted in FIG. 6, the leadframe 50 is attached to the semiconductor chip 60 by aligning the aperture 51 (FIG. 3) of the leadframe 50 with the adhesive-free area 68 and contacting the inner lead ends 53 to the adhesive layer 66. Attachment of the leadframe 50 to the semiconductor chip 60 is accomplished by applying opposing, respective pressure to the semiconductor chip 60 and leadframe 50 as indicated by the arrows 70 and 72. Pressure may be applied by any suitable technique, such as a movable arm pressing the assembly against a stationary platen (not shown). To further facilitate the bonding process, the adhesive layer 66 can be heated either before, during, or after the attachment of the leadframe 50 to the semiconductor chip 60. Heating the adhesive layer 66 may be accomplished by heating the leadframe 50 and/or the semiconductor chip 60 as by conductive, convective or radiant heating. The application of pressure (and heat, if applicable) effectively sandwiches the adhesive layer 66 between the inner lead ends 53 and the semiconductor chip 60, firmly attaching the leadframe 50 to the semiconductor chip 60.

Figure 7:
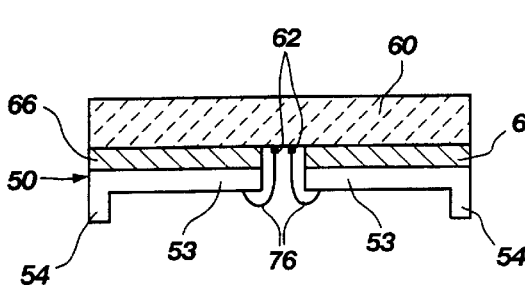

After leadframe 50 is adhered to semiconductor chip 60, the bond wires 76 are attached to the bond pads 62 of the semiconductor chip 60 and to the inner lead ends 53 of the leads 52 to electrically couple the semiconductor chip 60 to the leadframe 50, as depicted in FIG. 7. Any conventional wire bonding technique (e.g., ultrasonic, thermocompression, or thermosonic bonding) can be used to carry out the instant step. The bond wires 76 are typically formed from gold, aluminum, or alloys thereof, although other suitable materials may be used. Preferably, the bond wires 76 will be attached such that they have a low loop height, or clearance, relative to the active surface of the semiconductor chip 60.

Figure 8:
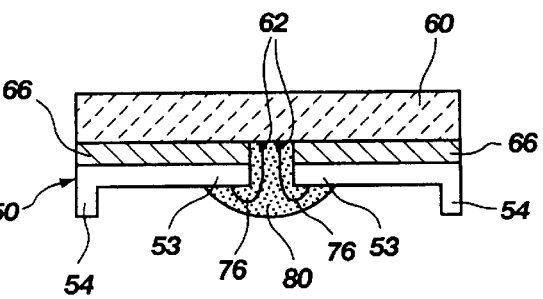

After wire bonding has been completed, a glob-topping 80 is applied over the wire bonded areas, as illustrated in FIG. 8, and then cured (if necessary). Glob-topping materials must be sufficiently robust when cured to secure and support the bond wires 76 in place, be electrically insulative to prevent shorting of the bond wires 76, and have relatively low viscosity during application to envelop bond wires 76 without leaving substantial voids. Additionally, the barrier glob top material is selected for low moisture permeability, low coefficient of thermal expansion, and good sealing properties. Preferred barrier glob top materials suitable for use in the present invention include epoxies, polyimides, urethanes, silicones, and acrylics.

Following encapsulation of the bond wires 76 extending between the leadframe 50 and semiconductor chip 60, a trimming step is carried out for cutting the end rails 58, 58' and side rails 56, 56' (see FIG. 3) so as to electrically separate each inner lead end 53 and an associated outer lead end 54 from other neighboring inner and outer lead ends 53 and 54, respectively. The trimming step is followed by a forming step for forming the outer lead ends 54 into predetermined configurations, such as a J-lead configuration (see FIG. 9A) typically used for mounting the outer lead ends 54 to the surface of a PCB. Preferably, the outer lead ends 54 are formed to extend laterally no greater than the width of the semiconductor chip 60, thus defining a package footprint which is no larger than the lateral dimensions of the semiconductor chip 60.

Figure 9A:
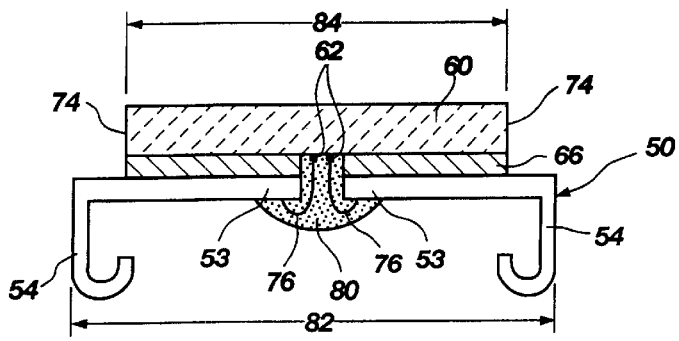
FIGS. 9A, 9B and 9C are cross-sectional views of other embodiments of a chip scale package structure made in accordance with the present invention.

FIG. 9A depicts another embodiment of a chip scale package structure made according to the principles of the invention. In this embodiment, the outer lead ends 54 are formed to have a width 82 which is greater than the width 84 of the semiconductor chip 60. Thus, the leadframe 50 extends beyond the outer lateral boundaries 74 of the semiconductor chip 60, forming a footprint which is larger than the dimensions of the semiconductor chip 60. This embodiment also includes outer lead ends 54 formed in a J-lead configuration typically used for mounting the outer lead ends 54 to the surface of a PCB. The present package configuration is particularly useful when mounting a semiconductor chip of small dimensions onto the surface of a PCB having relatively more widely spaced connecting points on circuit traces designed, for example, for use with a larger transfer-molded prior art package.

Figure 9B:
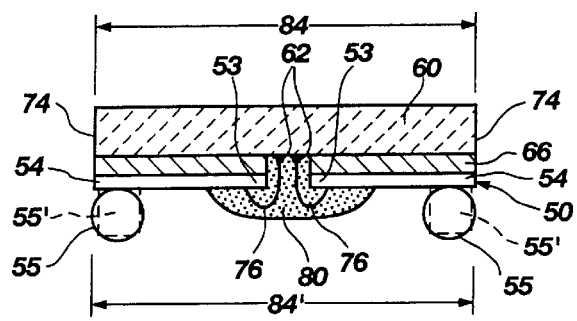

FIG. 9B depicts another embodiment of a chip scale package structure made according to the principles of the invention in the form of a ball grid array (BGA) and, more specifically, a fine ball grid array (FBGA) package. In this embodiment, the outer lead ends 54 are formed to have a width 84' which is substantially the same as the width 84 of the semiconductor chip 60. Thus, the leadframe 50 terminates substantially at the outer lateral boundaries 74 of the semiconductor chip 60, forming a footprint which is substantially the same as the dimensions of the semiconductor chip 60. This embodiment also includes outer lead ends 54 having transversely projecting conductive structures in the form of conductive bumps or balls 55 disposed thereon for connection of the chip scale package to traces on the surface of a carrier substrate such as a PCB. The conductive bumps or balls 55 may comprise a conventional tin/lead solder of suitable composition to achieve a desired melting point for reflow, a conductive epoxy or conductor-filled epoxy, all as known in the art. Alternatively, a strip of Z-axis conductive film 55', as shown in broken lines, may be employed to connect the outer lead ends to traces on a carrier substrate.

Figure 9C:
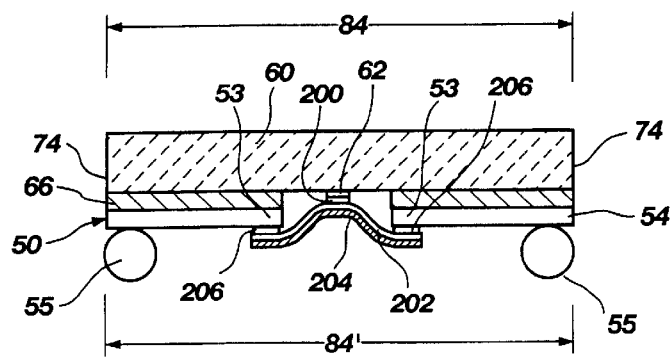

FIG. 9C depicts still another embodiment of a chip scale package structure made according to the principles of the invention in the form of a ball grid array (BGA) and, more specifically, a fine ball grid array (FBGA) package. In this embodiment, which is similar to the embodiment of FIG. 9B, the outer lead ends 54 are formed to have a width 84' which is substantially the same as the width 84 of the semiconductor chip 60. Thus, the leadframe 50 terminates substantially at the outer lateral boundaries 74 of the semiconductor chip 60, forming a footprint which is substantially the same as the dimensions of the semiconductor chip 60. This embodiment also includes outer lead ends 54 having conductive bumps or balls 55 disposed thereon for connection of the chip scale package to traces on the surface of a carrier substrate such as a PCB. As noted above, the conductive bumps or balls 55 may comprise a conventional tin/lead solder of suitable composition to achieve a desired melting point for reflow, a conductive epoxy, or conductor-filled epoxy, all as known in the art. Unlike the embodiment of FIG. 9B, which employs bond wires 76, the embodiment of FIG. 9C employs a TAB (tab automated bonding) structure 200 comprising a plurality of conductors 202 carried on a thin dielectric film 204, the conductors 202 being respectively conductively connected to bond pads 62 of the semiconductor chip 60 and to inner lead ends 53 using, by way of example only, thermocompression-bonded bumps 206. Of course, conductors 202 might be conductively, adhesively bonded to inner lead ends 53.

Figure 10:
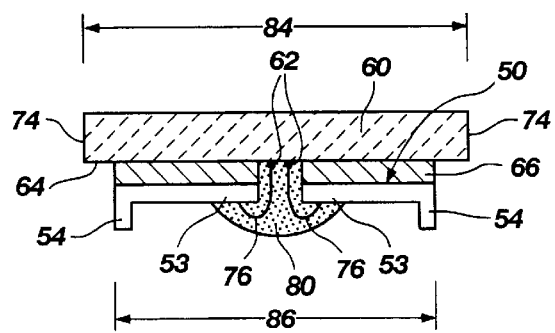
FIG. 10 is a cross-sectional view of still a further embodiment of a chip scale package structure made in accordance with the present invention.

FIG. 10 depicts a third embodiment of a chip scale package structure made according to the principles of the invention. To form the illustrated structure, the adhesive layer 66 is applied over a centrally-located portion (exclusive of portions of the semiconductor chip 60 located adjacent to the outer lateral boundaries 74) of the active surface 64 of the semiconductor chip 60, as shown in FIG. 10. Following attachment of the inner lead ends 53 to the semiconductor chip 60 (as previously described in conjunction with FIG. 6), the outer lead ends 54 are formed to have a width 86 which is smaller than the width 84 of the semiconductor chip 60. Thus, the leadframe 50 is formed such that the outer lead ends 54 lie in recessed relationship to the outer lateral boundaries 74 of the semiconductor chip 60, thus forming a footprint which is smaller than the dimensions of the semiconductor chip 60. This package configuration is particularly useful when mounting a semiconductor chip 60 having relatively large dimensions in comparison to the spacing of preexisting circuit trace connection points on the surface of a PCB.

Figure 11:
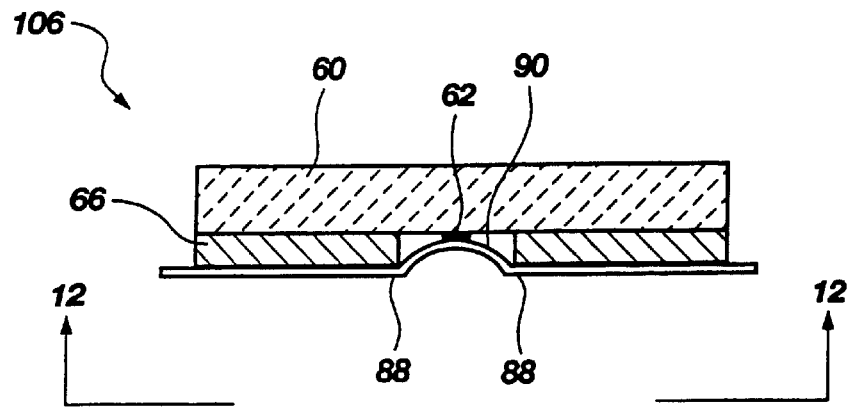
FIG. 11 is a cross-sectional view of yet another embodiment of a chip scale package structure made in accordance with the present invention.
Figure 12:
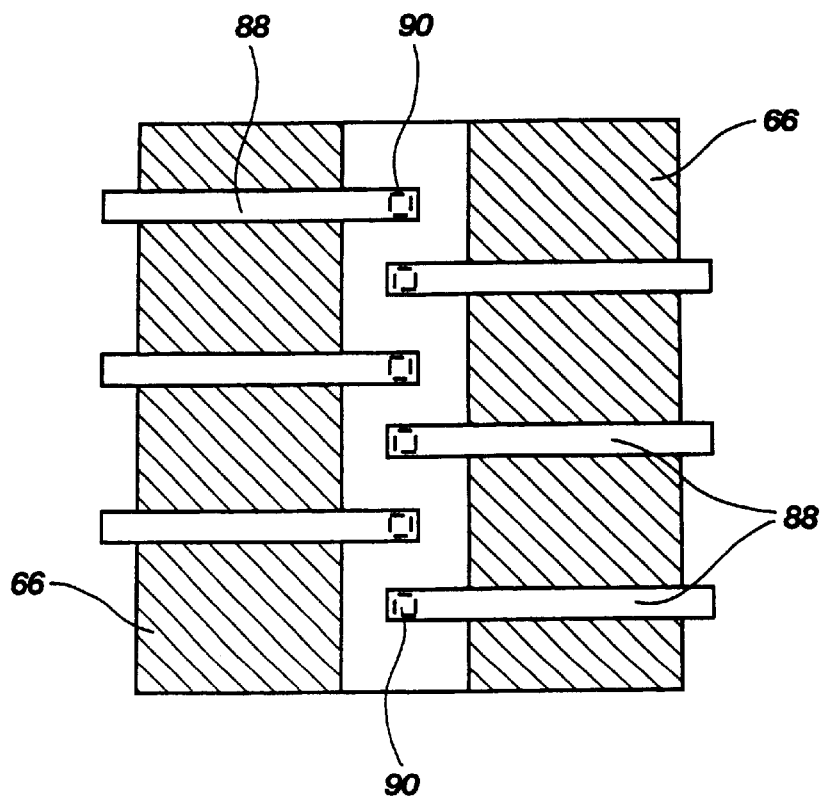
FIG. 12 is a bottom view of the chip scale package of FIG. 11 taken along line 12—12.
Figure 13:
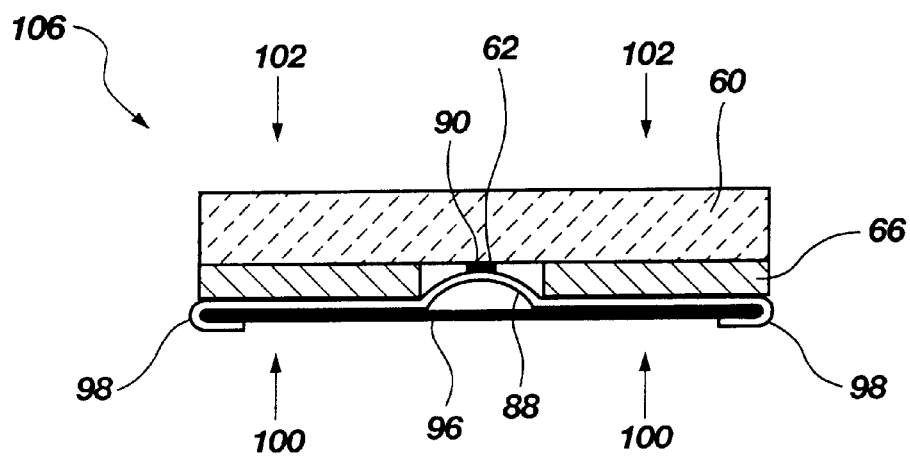
FIGS. 13 and 13A are cross-sectional views of additional embodiments of a chip scale package structure made in accordance with the present invention.

Referring now to FIGS. 11 through 13, a fourth embodiment of a chip scale package 106 made according to the method of the invention is shown. In this embodiment, the adhesive layer 66 is applied to the semiconductor chip 60 (as previously described in conjunction with FIG. 5). In this embodiment, as shown in FIG. 11, conductive bumps 90 are formed on the bond pads 62 (a process commonly known as chip or wafer "bumping") for bonding to flexible circuit (e.g., tape automated bonding (TAB) tape) leads 88. Flexible circuit leads 88 may be applied and then a supporting film (not shown) removed, or the film, if dielectric, may remain in place, both as known in the art. In either case, the TAB tape is applied to semiconductor chip 60 with flexible circuit leads 88 adjacent adhesive layer 66. As shown in FIG. 12, adhesive layer 66 may be carried over flexible circuit leads 88 on the tape and adhered to active surface 64 of semiconductor chip 60. The conductive bumps 90 can be formed prior or subsequent to application of adhesive layer 66 by any known method and can be made of various metals typically used for such purposes, the most common of which are gold, copper, aluminum, and solder, or may be comprised of a conductive or conductor-filled adhesive such as an epoxy. Alternately, bumping can be accomplished on the flexible circuit leads 88, which eliminates the aforementioned chip-bumping process. Known TAB tape structures, such as planar tape, bumped tape, transfer-bumped tape, and balltape, are suitable for use as a flexible circuit in the present method. Likewise, TAB tapes having various and multiple metal, adhesive, and/or dielectric layers (e.g., single, two, and three metal layer TAB tapes) are also suitable for use in the present invention. Further, and as noted with respect to chip-bumping, nonmetal bumps on the TAB tape may be employed, such as conductive epoxies or conductor-filled epoxies of the thermoplastic or thermosetting types.

Depending on which bumping technique is utilized, the flexible circuit leads 88 are then bonded to conductive bumps 90 formed on the bond pads 62, or are alternatively bonded to the bond pads 62 through conductive bumps 90 formed on the TAB tape flexible circuit leads 88. The TAB tape flexible circuit leads 88 are then attached to the adhesive layer 66 on the semiconductor chip 60, as described above in conjunction with FIG. 6. Alternately, the TAB tape flexible circuit leads 88 can be attached to the adhesive layer 66 prior to their being bonded to the bond pads 62.

As shown in FIG. 13, a cap 96 may then be attached to the TAB tape flexible circuit leads 88, preferably by wrapping and adhering outer TAB tape portions 98 around the cap 96 so that the TAB tape flexible circuit leads 88 are exposed beyond cap 96 for effecting electrical connection. Alternately, the cap 96 can be secured throughout a larger surface area to the TAB tape flexible circuit leads 88 by applying an adhesive to the exposed outer surface of the TAB tape flexible circuit leads 88 and/or to the inner surface of cap 96 and subsequently applying pressure, as indicated by the arrows 100 and 102. Pressure may be applied by any suitable technique, such as a movable arm or inflatable bladder pressing the assembly against a stationary platen. In this fashion, the cap 96 provides a thin physical barrier without significantly increasing the distance between the semiconductor chip 60 and the underlying PCB (not shown) once the chip scale package 106 is connected to the PCB, thus maintaining a low package height. As with the embodiments of FIGS. 9B and 9C, it should be noted that the package of FIG. 13 may be configured as a BGA or FBGA, using conductive bumps or balls 55 (see FIG. 9B) disposed on the outer TAB tape portions 98 to electrically connect the package to a carrier substrate. Of course, bond pads 62 may also be bumped as referenced at 90 to facilitate connection to the TAB tape flexible circuit leads 88.

The cap 96 can be made of any substantially nonconductive and flexible or rigid material, such as a polyimide, an FR-4, ceramic, or silicon. It is understood that the dimensions of various parts of the instant embodiment can vary. For example, the chip scale package 106 can have a footprint which is larger than, equal to, or smaller than the length or width of the semiconductor chip 60. The cap 96 can be configured in a variety of sizes and shapes to match the size and shape of the associated semiconductor chip 60 or, if rigid, in another size or shape to provide support for TAB tape flexible circuit leads 88 wrapped therearound to accommodate a specific connection pattern. The space between the cap 96 and the active surface of the semiconductor chip 60 may be filled with an insulative material, such as is used for glob-topping or flip-chip underfill, if desired.

Figure 13A:
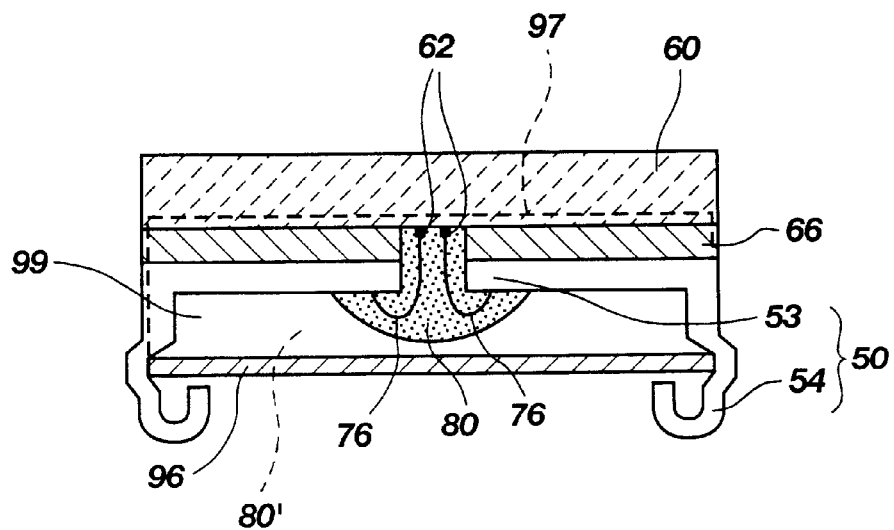

Referring to FIG. 13A, another embodiment of a capped chip scale package including a leadframe 50 (rather than TAB tape) is shown. The present embodiment is assembled according to the method described in conjunction with FIGS. 5 through 7. The outer lead ends 54 of the leadframe 50 are then formed to receive and resiliently hold the insulative cap 96 following the attachment of the bond wires 76. Cap 96 may include end flanges 97 (shown in broken line) to close off the ends of the space 99 between the main body of cap 96 and the active surface of semiconductor chip 60. Although the physical barrier created by the cap 96 obviates the need for deposition of a glob-topping or underfill compound in space 99 in most applications, a glob-topping 80 can be incorporated into the present structure for additional protection of the bond wires 76, if so desired. Alternatively, an underfill 80' may be used to completely fill space 99. As previously suggested, the dimensions of various parts of the instant embodiment can vary, particularly with respect to the size and shape of the cap 96 (and the associated footprint created by the leadframe 50) in relation to the size of the semiconductor chip 60.

Figure 14:
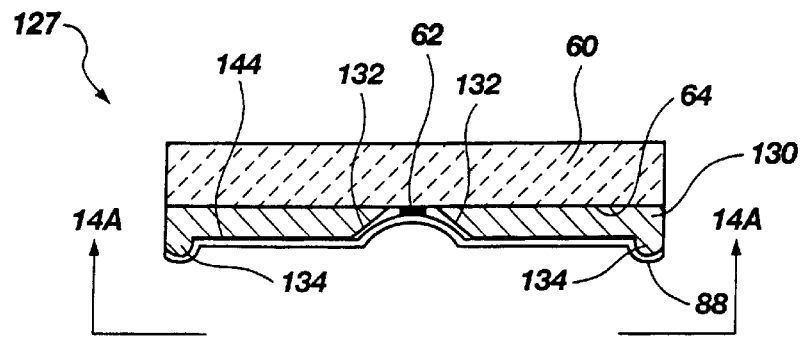
FIGS. 14 and 14A are cross-sectional and bottom views, respectively, of a further embodiment of the chip scale package structure of the present invention.
Figure 14A:
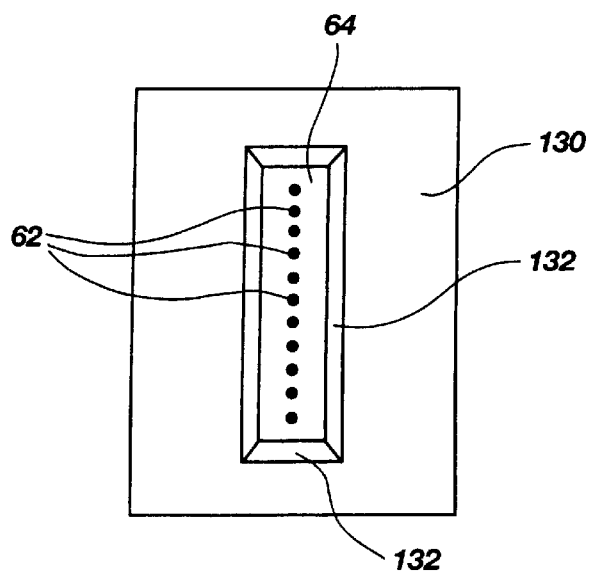

FIGS. 14 and 14A depict yet another alternate embodiment of the chip scale package of the present invention. FIG. 14 illustrates a chip scale package 127 prior to placement of external connection circuitry thereon. The chip scale package 127 includes an insulating or dielectric and passivating layer or plate 130 bonded (with any suitable adhesive material, as previously described) to the active surface 64 of the semiconductor chip 60 to provide physical protection for the active surface 64. Suitable materials for use as the passivating layer 130 should have low or no conductivity, produce no ionic contamination, provide good thermal conductivity and high physical robustness, and exhibit a coefficient of thermal expansion (CTE) that is similar to or the same as the CTE of the semiconductor chip 60. Preferred materials include silicon, as well as silicone and silicone-carbon resin structures.

Figure 14B:
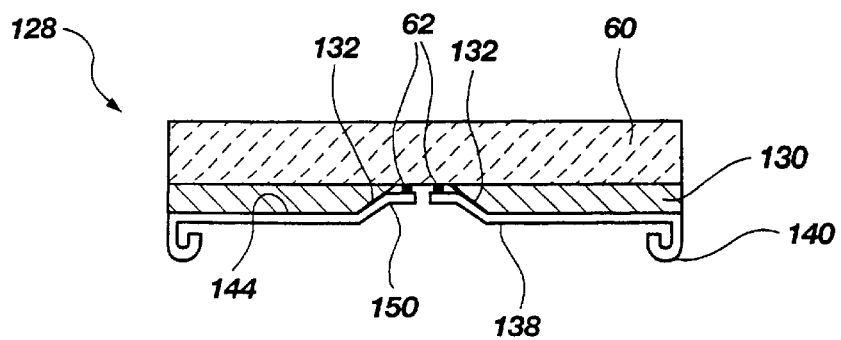
FIG. 14B is a modified embodiment of the chip scale package structure of FIG. 14A.

The passivating layer 130 is formed to include a beveled or sloped portion 132 adjacent to the area occupied by the bond pads 62 as shown in FIG. 14A. It is understood that the passivating layer 130 and the beveled portion 132 can vary in placement along the active surface 64 of the semiconductor chip 60, depending on the placement and configuration of the bond pads 62 on the active surface 64 of the semiconductor chip 60. For example, where the bond pads 62 are positioned in a non-linear or non-central configuration throughout the active surface 64 of the semiconductor chip 60, placement of the passivating layer 130 on active surface 64 can be modified to cover only those portions of the active surface 64 which do not contain bond pads 62. The passivating layer 130 also preferably includes one or more projecting or "bumped" regions 134 to facilitate connection or placement of the chip scale package 127 onto a semiconductor substrate carrying conductive traces (e.g., a PCB or FR-4 board). FIG. 14B illustrates an alternate embodiment that does not include bumped regions 134.

Flexible circuit (e.g., tape automated bonding (TAB) tape) leads 88 are closely fitted over an outer surface 144 and the beveled portion 132 of the passivating layer 130 and connected to bond pads 62. As previously described with respect to FIGS. 11 through 13, conductive bumps (not shown) can be formed on the bond pads 62 (a process commonly known as chip or wafer "bumping") or, alternatively, on the flexible circuit leads 88, for bonding of flexible circuit leads 88. TAB tape structures, such as planar tape, bumped tape, transfer-bumped tape, and balltape, are suitable for use as a flexible circuit in the present embodiment. In this embodiment, flexible circuit leads 88 would typically lie on the exterior side of the TAB tape and connect to bond pads through apertures in the supporting dielectric film. The outer ends of flexible circuit leads 88 extending over bumped regions 134 are employed in effecting external connections.

FIG. 14B depicts a modified embodiment 128 of the chip scale package 127 of FIG. 14. This preferred embodiment of chip scale package 128 of FIG. 14B differs from the chip scale package 127 of FIG. 14 in that it excludes bumped regions 134 and substitutes a leadframe 138 for the flexible circuit or TAB tape leads 88. The leadframe 138 includes outer lead ends 140 and inner lead ends 150. Outer lead ends 140 are shaped (e.g., J-lead configuration) to provide contact with the conductive traces of a carrier substrate (not shown) to which the chip scale package 128 is to be attached. The inner lead ends 150 are shaped to snugly fit the beveled portion 132 of the passivating layer 130 and over the bond pads 62 (in a double row) of the semiconductor chip 60, while permitting close contact to be maintained between the leadframe 138 and the outer surface 144 of the passivating layer 130. The inner lead ends 150 can be directly attached to the bond pads 62 of the semiconductor chip 60 as with thermocompression bonds to electrically couple the semiconductor chip 60 to the leadframe 138. Alternately, the leadframe 138 can be electrically coupled to the bond pads 62 by positioning the inner lead ends 150 proximate to the bond pads 62 and attaching bond wires (not shown) to the bond pads 62 and to the inner lead ends 150, as previously described in conjunction with FIG. 7. Any conventional bonding technique (e.g., ultrasonic, thermocompression, or thermosonic bonding) can be used to carry out the desired bonding step.

Figure 15:
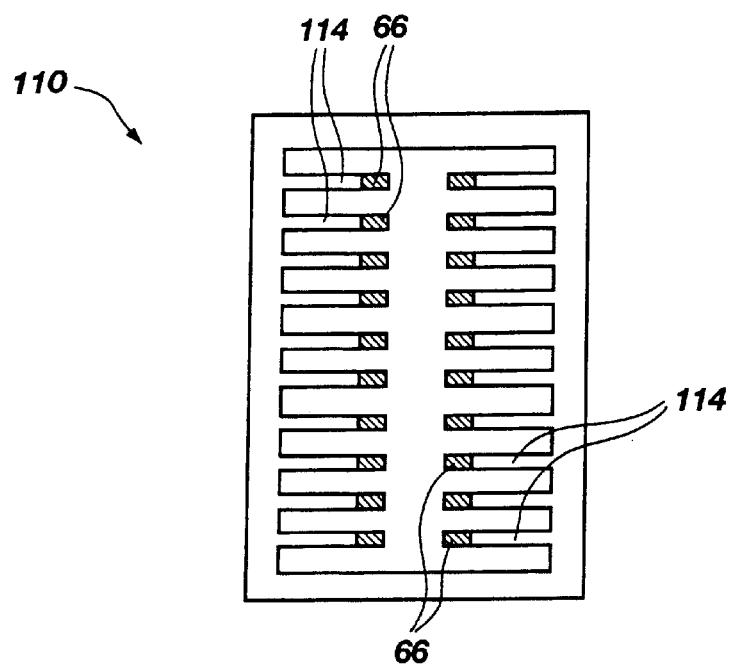
FIG. 15 is a top view of a leadframe coated with an adhesive layer in accordance with another method of the present invention.

FIG. 15 depicts an alternate embodiment of the method of the invention previously described in conjunction with FIG. 5. In the alternate embodiment, the adhesive layer 66 is applied directly to the lead fingers 114 of the leadframe 110 instead of to active surface 64 of the semiconductor chip 60 as previously described. The adhesive layer 66 may be deposited in a pattern that matches the placement of the lead fingers 114 on the semiconductor chip 60 (e.g., on the ends of lead fingers 114). Adhesive layer 66 can be formed on lead fingers 114 by using any of the previously described techniques and materials.

Figure 16:
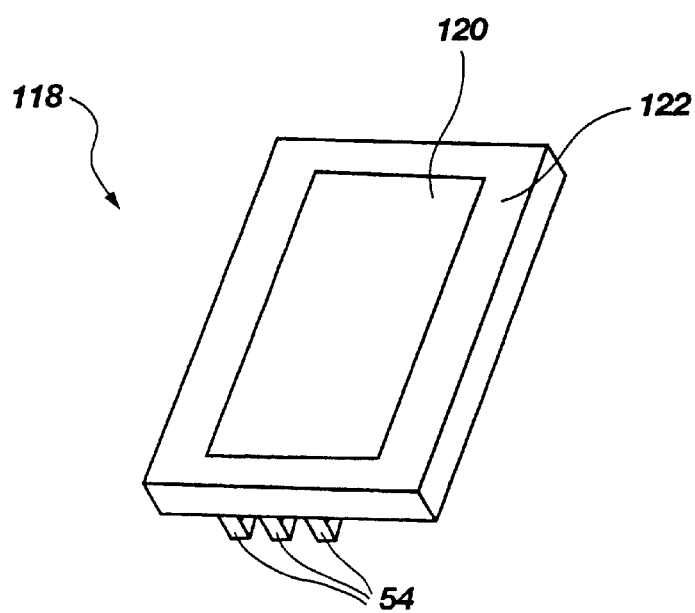
FIGS. 16 and 16A are perspective and cross-sectional views of a still further embodiment illustrating a framed chip scale package made in accordance with the present invention.
Figure 16A:
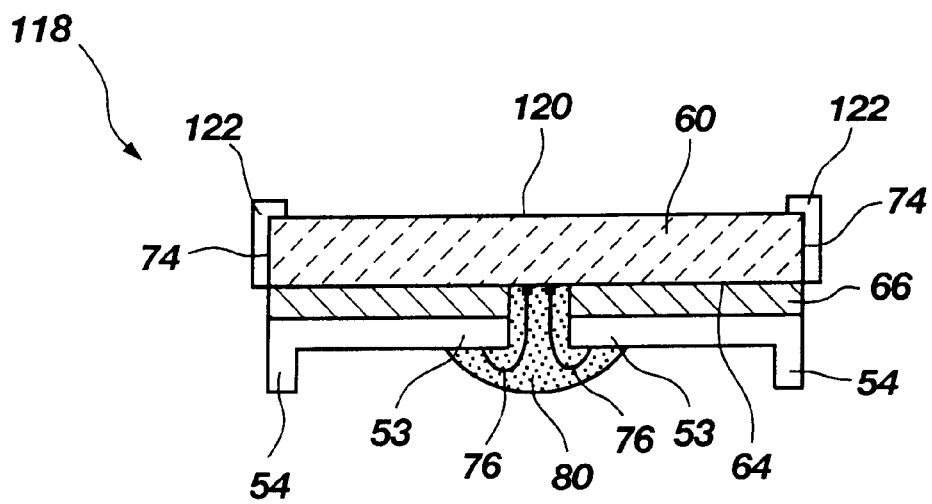
Figure 17:
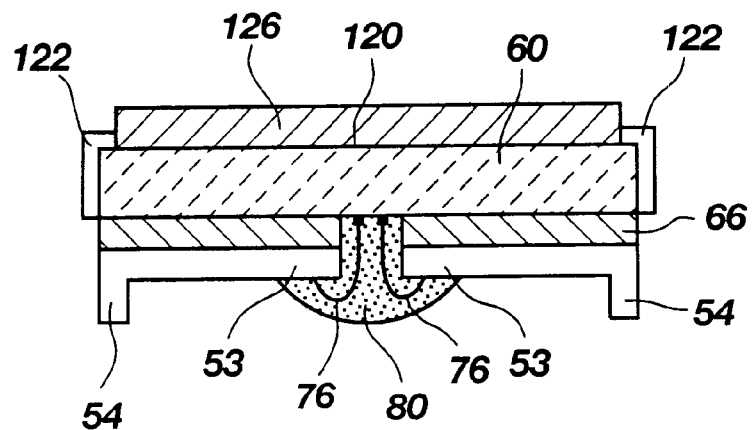
FIG. 17 is a cross-sectional view of another embodiment illustrating a chip scale package, including a frame and heat sink, made in accordance with the present invention.

FIGS. 16, 16A, and 17 represent alternate embodiments of the method and the resulting framed chip scale package structures of the invention. FIG. 16 represents a perspective view of a preferred embodiment of a framed chip scale package 118, including a back surface 120 of the semiconductor chip 60, the outer lead ends 54, and a frame 122. As shown in FIG. 16A, the frame 122 is preferably formed (e.g., molded) to fully cover the outer lateral boundaries 74 and to at least partially cover or overlap the back surface 120 of the semiconductor chip 60. Alternately, the frame 122 can be configured to completely cover the back surface 120. The frame 122 can be formed, either in part or as a whole, onto the semiconductor chip 60 during any of the package fabrication steps (as described in conjunction with FIGS. 5 through 8). Preferably, the frame 122 does not overlap the junction formed by the laterally outer chip boundaries 74 and the active surface 64. A sealant can also be applied between the frame 122, the back surface 120 and the outer lateral boundaries 74 for additional protection of the semiconductor chip 60 and adhesion of the frame 122 to the semiconductor chip 60.

Suitable materials for use in molding or forming the frame 122 should have low moisture permeability, nonconductivity (i.e., having low ionic contamination), good thermal conductivity, high physical resilience, and a low coefficient of thermal expansion (CTE). Preferred materials include FR4, epoxies, silicones, silicone-carbon resins, polyimides, and polyurethanes.

In order to transport heat dissipated by the chip scale package, a heat sink or cold plate 126 can be included, as shown in FIG. 17. The heat sink 126 is directly attached to the back surface 120 of the semiconductor chip 60 by any suitable means, such as by application of a thermally conductive adhesive, such as a silver solder or a thermally conductive epoxy. The heat sink is fabricated from material that is chosen for its ability to transfer heat away from the semiconductor chip 60 (i.e., high thermal conductivity material). Suitable materials to be used as heat sinks should have high thermal conductivities and low CTEs to match those of other components in the assembly, namely the semiconductor chip 60 and the frame 122. The heat sink 126 is preferably made of copper-clad molybdenum (CCM), copper-clad Invar (CCI), and carbon-fiber reinforced epoxy (C-Ep).

Although the preferred embodiments of the present invention have been disclosed for illustrative purposes, those skilled in the art will appreciate that various modifications, additions, and substitutions are possible, without departing from the scope and spirit of the invention as disclosed in the accompanying claims.

What is claimed is:

1. A semiconductor chip package comprising:
    a semiconductor chip having lateral boundaries, an active surface, a surface opposing the active surface, and bond pads on the active surface;
    a plurality of leads, each lead having an inner end attached to the active surface of the semiconductor chip and an outer end to provide an electrical connection external to the semiconductor chip package, at least a portion of each outer end formed at an angle relative to a position of each inner end;
    a plurality of bond wires interconnecting the semiconductor chip bond pads and the plurality of leads, each bond wire having a first end and a second end, the first end of each bond wire being connected to at least one of the bond pads and the second end of each bond wire being connected to the inner end of a lead of the plurality of leads; and
    protective shielding over the plurality of bond wires, the protective shielding having outer boundaries that are substantially coextensive with the lateral boundaries of the semiconductor chip and comprising a cap spaced away from and extending over the active surface of the semiconductor chip and extending between the outer ends of a plurality of the plurality of leads.

2. The semiconductor chip package of claim 1, wherein the protective shielding further comprises a protective coating over the plurality of bond wires, the protective coating lying between the cap and the active surface of the semiconductor chip.

3. The semiconductor chip package of claim 1, wherein the outer end of each lead is configured as a J-lead.

4. A semiconductor chip package comprising:
    a semiconductor chip having lateral boundaries, an active surface, a surface opposing the active surface, and bond pads on the active surface;
    a plurality of tape automated bonding (TAB) leads, each TAB lead having an inner end attached to one of the bond pads of the semiconductor chip and to the active surface of the semiconductor chip and having an outer end to provide an electrical connection external to the semiconductor chip package; and
    a cap protecting the active surface of the semiconductor chip, the cap being spaced away from and over the active surface of the semiconductor chip, extending between the outer ends of at least some of the plurality of TAB leads, and having outer boundaries that are substantially coextensive with the lateral boundaries of said semiconductor chip.

5. The semiconductor chip package of claim 4, further including a heat sink attached to the semiconductor chip.

6. A semiconductor chip package comprising:
a semiconductor chip having lateral boundaries, an active surface, a surface opposing the active surface, and bond pads on the active surface;
a plurality of leads, each lead having an inner end attached to the active surface of the semiconductor chip and an outer end to provide an electrical connection external to the semiconductor chip package, at least a portion of each outer end formed at an angle relative to a position of each inner end;
a plurality of bond wires interconnecting the semiconductor chip bond pads and the plurality of leads, each bond wire having a first end and a second end, the first end of each bond wire being connected to at least one of the bond pads and the second end of each bond wire being connected to the inner end of a lead of the plurality of leads;
protective shielding over the plurality of bond wires, the protective shielding having outer boundaries that are substantially coextensive with the lateral boundaries of the semiconductor chip; and
a frame attached about the lateral boundaries and at least a portion of the opposing surface of the semiconductor chip.

7. The semiconductor chip package of claim 6, wherein the protective shielding comprises a protective coating over the plurality of bond wires.

8. The semiconductor chip package of claim 6, wherein the protective shielding comprises a cap spaced away from and extending over the active surface of the semiconductor chip and extending between the outer ends of a plurality of the plurality of leads.

9. The semiconductor chip package of claim 8, wherein the protective shielding further comprises a protective coating over the plurality of bond wires, the protective coating lying between the cap and the active surface of the semiconductor chip.

10. The semiconductor chip package of claim 6, wherein the outer end of each lead is configured as a J-lead.

11. The semiconductor chip package of claim 6, further including a heat sink attached to the semiconductor chip.

12. A semiconductor chip package comprising:
a semiconductor chip having lateral boundaries, an active surface, a surface opposing the active surface, and bond pads on the active surface;
a plurality of tape automated bonding (TAB) leads, each TAB lead having an inner end attached to one of the bond pads of the semiconductor chip and to the active surface of the semiconductor chip and having an outer end to provide an electrical connection external to the semiconductor chip package;
a cap protecting the active surface of the semiconductor chip, the cap being spaced away from and over the active surface of the semiconductor chip, extending between the outer ends of at least some of the plurality of TAB leads, and having outer boundaries that are substantially coextensive with the lateral boundaries of the semiconductor chip; and
a frame attached about the lateral boundaries and at least a portion of the opposing surface of the semiconductor chip.

13. The semiconductor chip package of claim 12, further including a heat sink attached to the semiconductor chip.

* * * * *

UNITED STATES PATENT AND TRADEMARK OFFICE
CERTIFICATE OF CORRECTION

PATENT NO. : 6,576,993 B2
DATED : June 10, 2003
INVENTOR(S) : Salman Akram

It is certified that error appears in the above-identified patent and that said Letters Patent is hereby corrected as shown below:

Title page,
Item [56], References Cited, U.S. PATENT DOCUMENTS, change "6,492,204" to -- 6,492,201 --

Column 8,
Line 17, change "(tab" to -- (tape --

Signed and Sealed this

Thirtieth Day of November, 2004

JON W. DUDAS
*Director of the United States Patent and Trademark Office*